United States Patent
Hsin et al.

(10) Patent No.: US 9,611,392 B2
(45) Date of Patent: Apr. 4, 2017

(54) SELF-ASSEMBLY COATING MATERIAL, HEAT SINK AND METHOD OF FORMING HEAT SINK

(75) Inventors: Yu-Lin Hsin, Tainan (TW); Chih-Kuang Chang, Tainan (TW); Mei-Hua Wang, Miaoli County (TW); Ting-Yao Su, Pingtung County (TW); Hsiao-Chun Yeh, Taichung (TW)

(73) Assignee: Industrial Technology Research Institute, Hsinchu (TW)

( * ) Notice: Subject to any disclaimer, the term of this patent is extended or adjusted under 35 U.S.C. 154(b) by 300 days.

(21) Appl. No.: 13/610,873

(22) Filed: Sep. 12, 2012

(65) Prior Publication Data

US 2013/0157041 A1 Jun. 20, 2013

(30) Foreign Application Priority Data

Dec. 15, 2011 (TW) .............................. 100146542 A
Jun. 8, 2012 (TW) .............................. 101120693 A (51) Int. Cl.
*C09D 163/00* (2006.01)
*B05D 7/24* (2006.01)
(Continued)

(52) U.S. Cl.
CPC .............. *C09D 5/00* (2013.01); *C09D 7/1225* (2013.01); *C09D 7/1291* (2013.01); *F28F 13/18* (2013.01); *F28F 21/02* (2013.01); *H01L 23/373* (2013.01); *H01L 23/3737* (2013.01); *H05K 7/20427* (2013.01); *C01P 2002/82* (2013.01);
(Continued)

(58) Field of Classification Search
CPC ......................... H01L 23/373; H01L 23/3737
See application file for complete search history.

(56) References Cited

U.S. PATENT DOCUMENTS

| | | | | |
|---|---|---|---|---|
| 3,655,565 A | * | 4/1972 | McDonald | H01B 3/04 427/443.2 |
| 4,565,854 A | * | 1/1986 | Sato | C08F 2/38 526/214 |

(Continued)

FOREIGN PATENT DOCUMENTS

| CN | 101702379 | 5/2010 |
|---|---|---|
| CN | 101847514 | 9/2010 |

(Continued)

OTHER PUBLICATIONS

Lota et al., "Effect of nitrogen in carbon electrode on the supercapacitor performance," Chemical Physics Letters 404, Mar. 7, 2005, pp. 53-58.

(Continued)

*Primary Examiner* — Ronak Patel
(74) *Attorney, Agent, or Firm* — Jianq Chyun IP Office (57) ABSTRACT

A self-assembly coating material including carbon particles and polymer shells is provided. The polymer shells respectively cover and are bonded to the carbon particles, wherein each polymer shell has both a first functional group for adsorbing on a surface of a substrate and a second functional group for self cross-linking. The first functional groups include thiol groups. The second functional groups include epoxy groups or carboxylic groups. The self-assembly coating material can be applied to a metal substrate to form a heat dissipation layer.

7 Claims, 6 Drawing Sheets

(51) Int. Cl.

| | |
|---|---|
| *B32B 5/16* | (2006.01) |
| *B82Y 30/00* | (2011.01) |
| *C09D 5/00* | (2006.01) |
| *C09D 7/12* | (2006.01) |
| *H01L 23/373* | (2006.01) |
| *H05K 7/20* | (2006.01) |
| *F28F 13/18* | (2006.01) |
| *F28F 21/02* | (2006.01) |
| *C09C 1/56* | (2006.01) |
| *F28F 3/02* | (2006.01) |

(52) U.S. Cl.
CPC ...... *C01P 2002/88* (2013.01); *C01P 2006/32* (2013.01); *C09C 1/56* (2013.01); *F28F 3/02* (2013.01); *H01L 2924/0002* (2013.01); *Y10T 428/254* (2015.01)

(56) References Cited

U.S. PATENT DOCUMENTS

| | | | |
|---|---|---|---|
| 6,356,432 | B1 | 3/2002 | Danel et al. |
| 6,665,169 | B2 | 12/2003 | Tennent et al. |
| 7,061,749 | B2 | 6/2006 | Liu et al. |
| 7,167,354 | B2 | 1/2007 | Dietz et al. |
| 7,466,539 | B2 | 12/2008 | Dementiev et al. |
| 7,745,528 | B2 | 6/2010 | Prud'Homme et al. |
| 7,931,969 | B2 | 4/2011 | Lin |
| 2002/0062600 | A1* | 5/2002 | Mandigo et al. ............... 51/293 |
| 2009/0035623 | A1 | 2/2009 | Tsuji |
| 2009/0189129 | A1 | 7/2009 | Lin |
| 2009/0294081 | A1 | 12/2009 | Gadkaree et al. |
| 2010/0008021 | A1 | 1/2010 | Hu et al. |
| 2010/0129558 | A1 | 5/2010 | Yagi et al. |
| 2010/0136256 | A1 | 6/2010 | Hwang et al. |
| 2010/0163783 | A1 | 7/2010 | Fung et al. |
| 2010/0227323 | A1* | 9/2010 | Baeumner ........ G01N 27/44747 435/6.19 |
| 2010/0304101 | A1* | 12/2010 | Lin et al. ...................... 428/212 |
| 2011/0133132 | A1 | 6/2011 | Zhamu et al. |
| 2012/0003479 | A1* | 1/2012 | Hsin et al. .................... 428/407 |
| 2012/0018708 | A1* | 1/2012 | Cho .................... H01L 51/0036 257/40 |

FOREIGN PATENT DOCUMENTS

| | | |
|---|---|---|
| EP | 1027716 | 8/2000 |
| FR | 2867600 | 9/2005 |
| JP | 2004174469 | 6/2004 |
| JP | 2005-305993 | 11/2005 |
| KR | 10-1046895 | 1/2007 |
| KR | 101031227 | 4/2011 |
| KR | 20110040027 | 4/2011 |
| TW | 516051 | 1/2003 |
| TW | I259211 | 8/2006 |
| TW | 201020301 | 6/2010 |
| TW | M403877 | 5/2011 |
| WO | 2008154691 | 12/2008 |
| WO | 2010088186 | 8/2010 |
| WO | 2010120560 | 10/2010 |

OTHER PUBLICATIONS

Kim et al, "Electrochemical Characterization of Solid-State Electric Double Layer Capacitors assembled with Sulfonated Poly (ether ether ketone)," 207th ECS Meeting Abstracts, May 17, 2005, pp. 164.

Sopčić et al., "Use of Polymers and their Composites with Ruthenium Oxide as Active Electrode Materials in Electrochemical Supercapacitors," Polimeri 31, Jul. 2010, pp. 8-13.

Okajima et al., "Capacitance Properties of C60-loaded Activated Carbon Electrodes for High Power Electrochemical Supercapacitor," 206th ECS Meeting Abstracts, Oct. 2004, pp. 637.

Dikin et al., "Preparation and characterization of graphene oxide paper," Nature 448, Jul. 26, 2007, pp. 457-460.

Lei et al., "Intercalation of mesoporous carbon spheres between reduced graphene oxide sheets for preparing high-rate supercapacitor electrodes," Energy and Environmental Science 4, Apr. 9, 2011, pp. 1866-1873.

Chen et al., "Electrochemical and capacitive properties of polyaniline-implanted porous carbon electrode for supercapacitors," Journal of Power Sources 117, May 15, 2003, pp. 273-282.

Hanzelka et al., "Thermal radiative properties of a DLC coating," Cryogenics 48, Sep.-Oct. 2008, pp. 455-457.

Eriksson et al., "Surface Coating for Radiative Cooling Applications: Silicon Dioxide and Silicon Nitride Made by Reactive rf-Sputtering," Solar Energy Materials 12, Nov. 1985, pp. 319-325.

Suryawanshi et al., "Radiative Cooling: Lattice Quantization and Surface Emissivity in Thin Coatings," ACS Applied Materials & Interfaces 1 (6), May 27, 2009, pp. 1334-1338.

Nilsson et al., "Radiative cooling during the day: simulations and experiments on pigmented polyethylene cover foils," Solar Energy Materials and Solar Cells 37 (1), Apr. 1, 1995, pp. 93-118.

Dobson et al., "Thin semiconductor films for radiative cooling applications," Solar Energy Materials & Solar Cells 80 (3), Nov. 1, 2003, pp. 283-296.

"Office Action of China Counterpart Application" , issued on Dec. 1, 2014, p3. 1-p. 6.

* cited by examiner

SELF-ASSEMBLY COATING MATERIAL, HEAT SINK AND METHOD OF FORMING HEAT SINK

CROSS-REFERENCE TO RELATED APPLICATION

This application claims the priority benefits of Taiwan application serial no. 100146542, filed on Dec. 15, 2011, and Taiwan application serial no. 101120693, filed on Jun. 8, 2012. The entirety of each of the above-mentioned patent applications is hereby incorporated by reference herein and made a part of specification.

TECHNICAL FIELD

The technical field relates to a self-assembly coating material, a heat sink and a method of forming the heat sink.

BACKGROUND

Heat dissipation is a requirement to meet for many electronic devices. Extra heat is generated during the operation of the electronic device, and overheat would affect the performance and reliability of the electronic device. A heat pipe or a heat sink is frequently used as an element for dissipating the extra heat, such that the electronic device would not be overheated. Heat transfer may occur by the mechanisms of conduction, convection and radiation.

The mechanism of conduction or convection is adopted for a traditional heat sink to achieve the purpose of heat dissipation. However, the current electronic device tends to become miniaturization. The space and weight are limited especially for a portable electronic device, such that many known heat sinks cannot be designed in such device.

The technology using the mechanism of radiation has been developed to meet the heat dissipation requirement for the current electric device. A layer of heat radiation coating material or nano-size powder is applied to the heat source surface to dissipate heat efficiently by heat radiation. Due to the limited space and volume of the current electric device, the best way for cooling the object surface is by heat radiation, and the heat is released to the external environment in the form of infrared ray. When the object has a temperature higher than the ambient temperature, heat can be released to the environment by radiation.

SUMMARY

One of exemplary embodiments comprises a self-assembly coating material which includes a plurality of carbon particles and a plurality of polymer shells. The polymer shells respectively cover and are bonded to the carbon particles, wherein each polymer shell has a first functional group and a second functional group, the first functional groups comprise thiol group, and the second functional groups comprise epoxy groups or carboxylic groups.

One of exemplary embodiments comprises a heat sink which includes a substrate and a heat dissipation coating material covering a surface of the substrate. The coating material comprises carbon particles each covered and bonded with a polymer shell, and wherein the polymer shells of the heat dissipation coating material are bonded to the surface of the substrate through first and second functional groups, the first functional groups comprise thiol groups, and the second functional groups comprise epoxy or carboxylic groups.

One of exemplary embodiments comprises a method of forming a heat sink including the following steps. A plurality of polymer chains is grafted onto a surface of a carbon particle, wherein each polymer chain has a first functional group, and the first functional groups comprise epoxy groups or carboxylic groups. A portion of the first functional groups of the polymer chains are replaced with second functional groups, so as to form a modified carbon particle, wherein the second functional groups comprise thiol groups. A plurality of the modified carbon particles is covered on a surface of the substrate. A cross-linking agent is added on the surfaces of the carbon particles and a cross-linking reaction is carried out to form a heat dissipation layer on the substrate.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
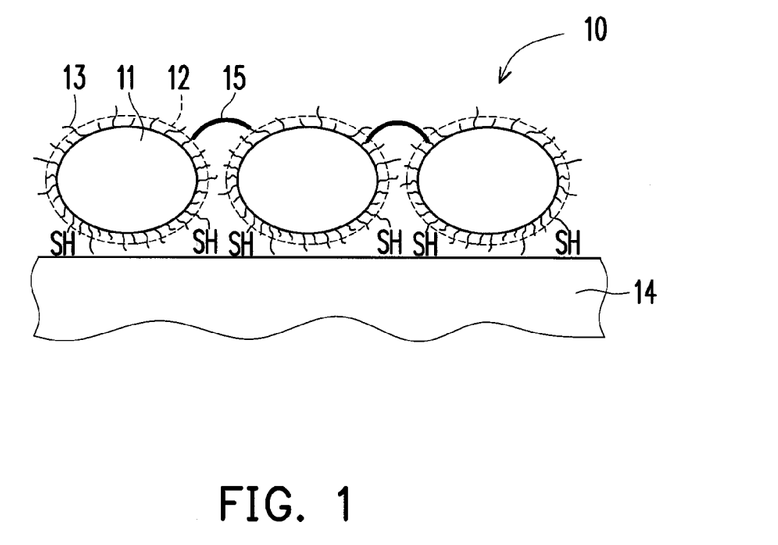
FIG. 1 schematically illustrates a structure of a coating material according to an embodiment of the disclosure.

FIG. 1 schematically illustrates a structure of a coating material according to an embodiment of the disclosure. Referring to FIG. 1, a coating material 10 of the disclosure includes a plurality of carbon particles 11 and a plurality of polymer shells 12. The carbon particles 11 include carbon nanotubes, diamond particles, graphite powder, carbon black, carbon fibers, graphenes or a mixture thereof. The polymer shells 12 respectively cover and are bonded to the carbon particles 11, wherein each polymer shell 12 has a first functional group for adsorbing on a surface of a substrate 14 and a second functional group for self cross-linking. The substrate 14 can be a metal substrate including Al, Al—Mg alloy, Cu or stainless steel. The first functional groups include thiol groups (—SH), and the second functional groups include epoxy groups or carboxylic groups (—COOH).

In addition, the polymer shells 12 account for about 1-20 wt %, or about 5-15 wt %, of the coating material 10. Each polymer shell 12 includes a plurality of polymer chains 13, and the weight-average molecular weight of each polymer chain 13 ranges from about 50,000 to about 150,000. In an embodiment, each polymer chain 13 includes a partially-thiolated epoxy-containing polymer, such as partially-thiolated polyglycidyl methacrylate (PGMA) or partially-thiolated poly 2-(4-vinylphenyl)oxirane. In another embodiment, each polymer chain 13 includes a partially-thiolated carboxyl-containing polymer, such as partially-thiolated polyacrylic acid.

The disclosure further provides a heat sink for radiation including a substrate 14 and a coating material 10. The coating material 10 of the disclosure is self-assembly coated on the substrate 14, wherein thiol groups of the polymer shells 12 are for adsorbing on a surface of the substrate 14, and epoxy groups and/or carboxylic groups are for self cross-linking. In FIG. 1, the cross-linking 15 between the composite particles is marked with a bold line. Further, the thickness of the coating material 10 applied on the substrate 14 is equal to or less than about 35 μm.

The disclosure also provides a heat sink for radiation including a substrate and a heat dissipation coating material covering a surface of the substrate. The coating material includes carbon particles each covered and bonded with a polymer shell. The polymer shells of the heat dissipation coating material are bonded to the surface of the substrate through first and second functional groups, the first functional groups include thiol groups, and the second functional groups include epoxy groups or carboxylic groups.

In an embodiment, a method of forming a heat sink of the disclosure includes the following steps. First, a plurality of polymer chains is grafted onto the surface of a carbon particle 11, wherein each polymer chain has a first functional group for self cross-linking. The first functional groups include epoxy groups or carboxylic groups. When the first functional groups include epoxy groups, each polymer chain can be polyglycidyl methacrylate (PGMA) or poly 2-(4-vinylphenyl)oxirane, for example. When the first functional groups include carboxylic groups, each polymer chain can be polyacrylic acid, for example.

Thereafter, a portion of the first functional groups of the polymer chains are replaced with second functional groups for adsorbing on a surface of a substrate 14, so as to form a modified carbon particle (i.e. coating material 10). The second functional groups include thiol groups. Herein, each polymer chain 13 includes partially thiolated epoxy-containing (or carboxyl-containing) polymer.

Afterwards, a plurality of the modified carbon particles (i.e. coating material 10) is covered on the surface of the substrate 14. The substrate 14 can be a metal substrate including Al, Al—Mg alloy, Cu or stainless steel. The covering method includes spin coating, spraying, blade coating or dipping. No adhesive is used during the covering/coating process.

Further, a cross-linking agent is added to the surfaces of the carbon particles 11 and a cross-linking reaction is carried out, so as to form a heat dissipation layer on the substrate 14. The carbon particles 11 account for about 80-99 wt % of the heat dissipation layer. The thickness of the heat dissipation layer is equal to or less than about 35 μm.

Figure 2A:
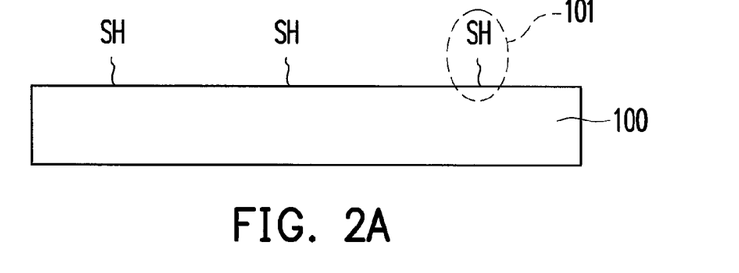
FIG. 2A to FIG. 2C are schematic cross-sectional views illustrating a method of forming a heat sink according to an embodiment of the disclosure.
Figure 2B:
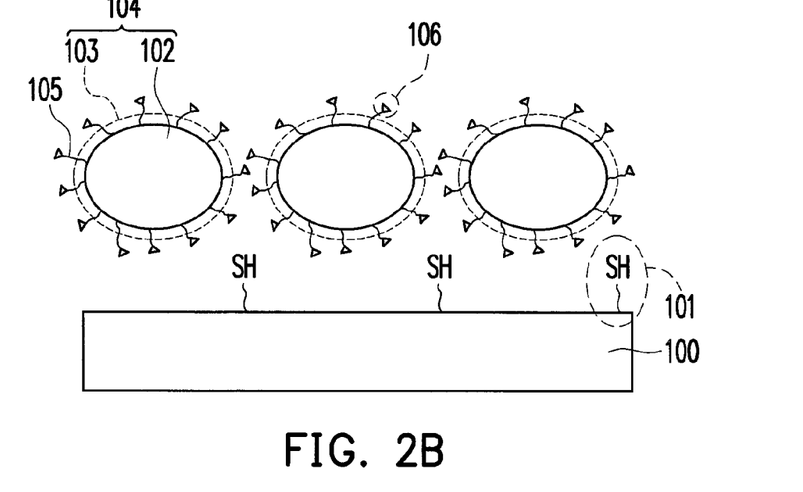
Figure 2C:
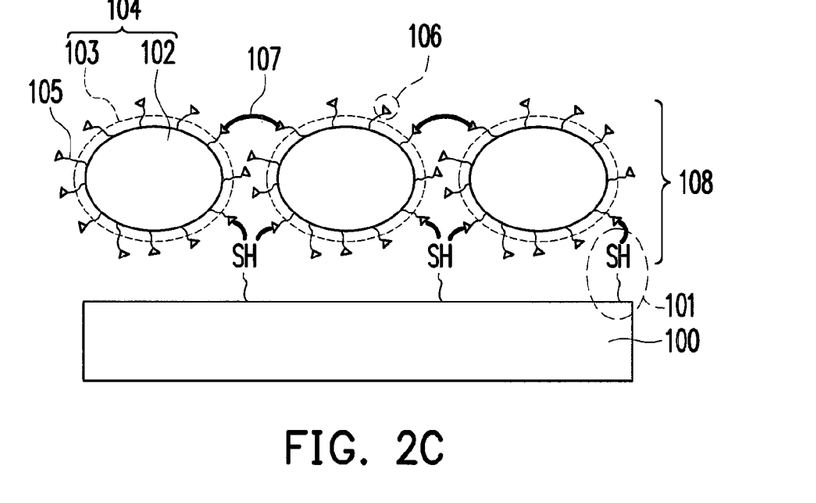

FIG. 2A to FIG. 2C are schematic cross-sectional views illustrating a method of forming a heat sink according to an embodiment of the disclosure.

Referring to FIG. 2A, a surface treatment step is performed on a substrate 100, so as to generate a plurality of functional groups 101 on a surface of the substrate 100. The substrate 100 is made of stainless steel, aluminium, copper, gold, silver, nickel, titanium, or an alloy thereof, for example. The surface treatment step is performed on the surface of the substrate 100 with use of thiol-containing organic acid or thiol-containing organic amine, for example. The functional groups 101 are thiol groups, for example.

Referring to FIG. 2B, the surface of the substrate 100 is covered with a plurality of carbon particles 102 each covered and bonded with a polymer shell 103. Each of the carbon particles 102 covered and bonded with the polymer shell 103 may be considered as a modified carbon particle 104. The covering method includes spin-coating, spray, blade coating, or immersion. Each of the polymer shells 103 has a plurality of functional groups 106 for cross-linking. The functional groups 106 include epoxy groups or carboxylic groups. The carbon particles 102 include active carbon, carbon nanotubes, diamond particles, graphite powder, carbon black, carbon fibers, graphenes, or a mixture thereof. Besides, the carbon particles 102 account for about 80-99 wt % of the modified carbon particles 104. Namely, the carbon particles 102 account for about 80-99 wt % of the heat dissipation layer 108 which is subsequently formed.

In addition, each of the polymer shells 103 includes a plurality of polymer chains 105. The weight-average molecular weight of each polymer chain 105 ranges from about 50,000 to about 150,000. The functional groups 106 in the polymer chains 105 include epoxy groups or carboxylic groups. Each polymer chain 105 includes polyglycidyl methacrylate (PGMA), poly 2-(4-vinylphenyl)oxirane or polyacrylic acid. Besides, the functional groups 106 in the polymer chains 105 may be the same or different. In an embodiment of the disclosure, the polymer shells 103 include either epoxy-containing polymer or carboxyl-containing polymer. In another embodiment of the disclosure, the polymer shells 103 include both epoxy-containing polymer and carboxyl-containing polymer.

Referring to FIG. 2C, a cross-linking agent is added to surfaces of the modified carbon particles 104, and the substrate 100 is heated to carry out a cross-linking reaction, such that a heat dissipation layer 108 is formed on the substrate 100. The thickness of the heat dissipation layer 108 is equal to or less than about 35 μm. In FIG. 2C, the lines in bold print represent the cross-linking phenomenon 107.

Several Examples and Comparative Examples are numerated below for further illustration. The following description in which the coating material is applied to a surface of a heat dissipation fin is provided for illustration purposes, and is not construed as limiting the present disclosure.

Example 1

In Example 1, a surface modification was performed to diamond particles with carbon $sp^3$ structure. In order to make surfaces of the diamond particles beneficial to the subsequent modification process, a surface graphitization treatment was performed so as to provide carbon $sp^2$ structure on the surfaces of the diamond particles. The diamond particles were heated at 1,200° C. for 30 minutes under inert gas atmosphere, so as to graphitize the surfaces of the diamond particles.

Figure 3:
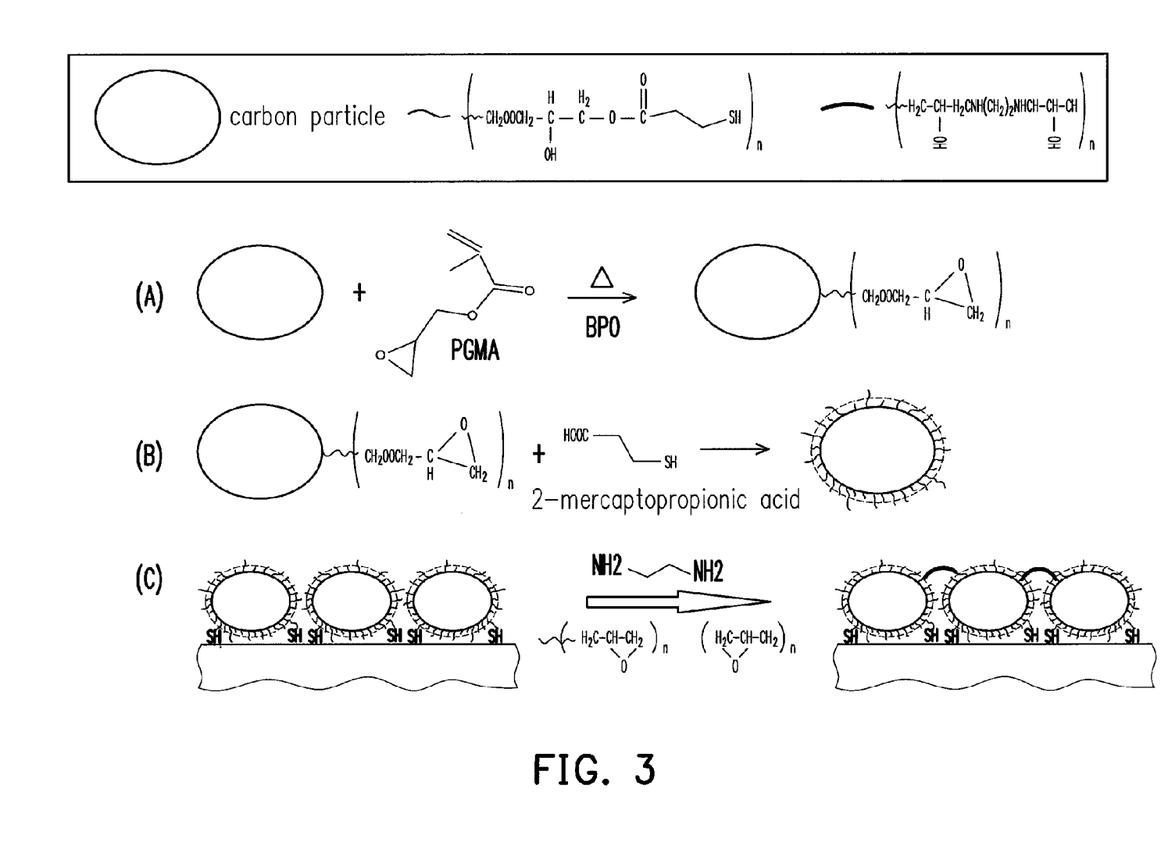
FIG. 3 schematically illustrates a flow of forming a heat dissipation coating material which is self-assembly coated on a substrate according to an embodiment of the disclosure.

Thereafter, epoxy-containing polymer chains were grafted onto surfaces of the surface-graphitized diamond particles. Referring to the step (A) in FIG. 3, 10 g of the surface-graphitized diamond particles were dispersed in 100 ml of monomer solution of glycidyl methacrylate (GMA) under ultrasonic to completely disperse the diamond particles, and 10 g of benzoyl peroxide (BPO) as a radial initiator was gradually added thereto. A polymerization reaction of the monomer solution with BPO added was carried out at 80° C. under ultrasonic, such that a portion of the polymer radicals were directly grafted onto the surfaces of the diamond particles. Thereafter, the diamond particles grafted with polymer (or called PGMA grafted diamond particles) in the solution were isolated by high-speed centrifugation and free polymer was removed.

Further, a portion of epoxy groups in polymer chains were replaced with thiol groups. Referring to the step (B) in FIG. 3, 10 g of the PGMA grafted diamond particles were dispersed in 100 ml of dimethyl sulfoxide, and 0.02 g of 2-mercaptopropionic acid was then added to the solution. The whole solution was reacted at 100° C. for one hour, such that a ring-opening reaction was carried out between a portion of epoxy groups of the PGMA grafted diamond particles and 2-mercaptopropionic acid. The epoxy groups of the polymer chains were reacted with 2-mercaptopropionic acid, such that the portion of epoxy groups were replaced with thiol groups at ends of a portion of the polymer chains. The heat dissipation coating material of Example 1 was thus obtained.

Figure 6:
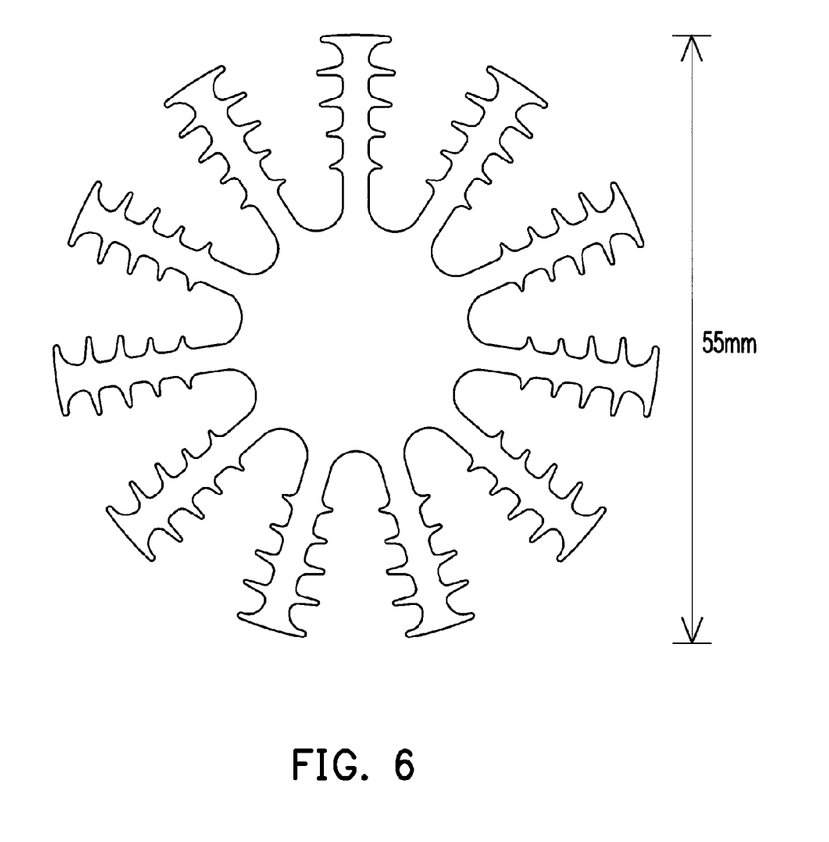
FIG. 6 is the shape of an aluminium heat dissipation fin used for Examples and Comparative Examples.

Afterwards, the heat dissipation coating material was coated on the surface of the substrate. Referring to the step (C) in FIG. 3, the heat dissipation coating material was dispersed in methyl ethyl ketone and diluted to a concentration of 3 wt %. The aluminium heat dissipation fin (as shown in FIG. 6) was done with an acid dipping treatment and then dried. Thereafter, the heat dissipation coating material was deposited on the aluminium surface by dipping or spraying, wherein thiol groups adsorbed and were bonded to the aluminium surface. The diamond particles were dipped in 0.5% ethylenediamine solution to allow the epoxy groups of the diamond particles to cross-link with each other and then baked at 100° C. to complete the reaction. Finally, a diamond thin film was formed on the aluminium surface. The sample of Example 1 was thus completed.

Figure 4:
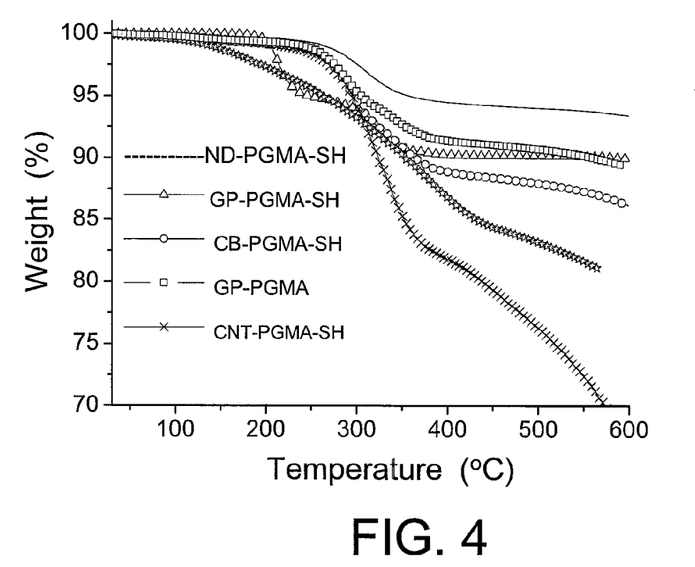
FIG. 4 illustrates a thermogravity analysis (TGA) of heat dissipation coating materials of Examples 1-5 of the disclosure.

FIG. 4 illustrates a thermogravity analysis (TGA) of the heat dissipation coating material of Example 1 (represented by ND-PGMA-SH) of the disclosure. As shown in FIG. 4, the polymer shells of the heat dissipation coating material of Example 1 are completely thermal-decomposed at 250-350° C., and the polymer shells are about 4% as calculated from the weight loss.

Figure 5:
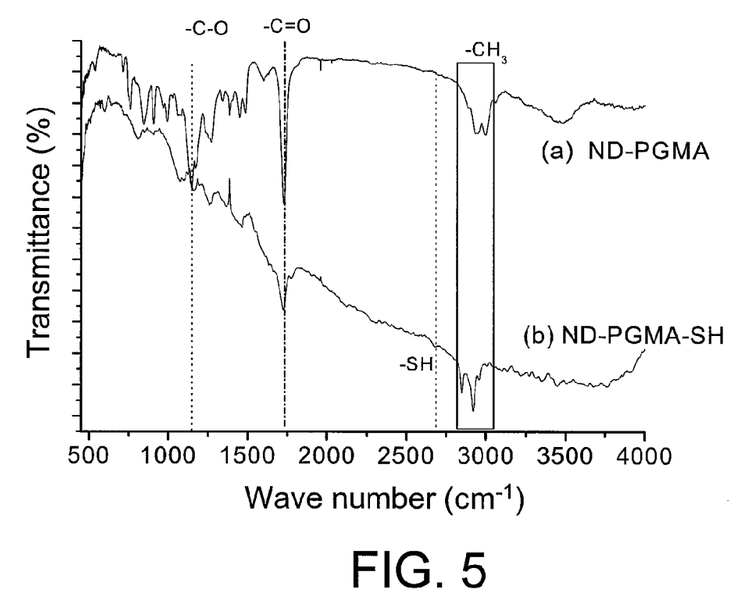
FIG. 5 is Fourier transform infrared (FTIR) spectrum of the heat dissipation coating material of Example 1.

FIG. 5 is Fourier transform infrared (FTIR) spectrum of the heat dissipation coating material of Example 1. Wavenumber at 2850-2980 cm$^{-1}$ (C—H stretching) and 1720 cm$^{-1}$ (C=O stretching) are clearly identified from the FTIR spectra. PGMA is characterized in wavenumber at 1150 cm$^{-1}$ (C—O stretching) of the epoxy groups. When a portion of epoxy groups of PGMA are replaced with thiol groups, the signal of C—O stretching is obviously weakened and a small signal of —SH stretching at 1150 cm$^{-1}$ is observed in the FTIR spectra. From the signal change of the FTIR spectra, it is anticipated that the diamond particles have PGMA grafted onto surfaces thereof and a portion of the epoxy groups are replaced with the thiol groups.

Afterwards, heat dissipation properties of the sample of Example 1 such as radiation emission, coating layer thickness, thermal resistance and thermal conductivity are evaluated. The measuring methods and results are detailed in below.

Example 2

In Example 2, a surface modification was performed to carbon nanotubes. Similarly, PGMA polymer chains were grafted onto surfaces of carbon nanotubes and the modified carbon nanotubes were self-assembly coated on a substrate surface.

Since carbon nanotubes were easy to be aggregated and some residue of metal catalyst remained during the synthesis process of carbon nanotubes, a mixture of $HNO_3$, $H_2SO_4$ and $H_2O_2$ in a ratio of 1:1:0.5 was used to thermal reflux at 130° C. for one hour, so as to remove the metal catalyst and oxidize a portion of the carbon nanotubes for de-aggregation. Thereafter, the mixed acid solution was diluted with water and removed by centrifugation. The carbon nanotubes were rinsed several times, and finally baked and dried to obtain the de-aggregated carbon nanotubes.

10 g of the de-aggregated carbon nanotubes were dispersed in 50% GMA monomer solution (solvent was THF). After the whole solution was reacted at 80° C. for one hour under ultrasonic, 10 g of benzoyl peroxide (BPO) as a radial initiator was gradually added thereto, such that PGMA polymer chains were evenly grafted onto the carbon nanotubes. Thereafter, free polymer was removed to obtain PGMA grafted carbon nanotubes.

The PGMA grafted carbon nanotubes were dispersed in dimethyl sulfoxide, and 0.2 wt % 2-mercaptopropionic acid (with respect to the carbon nanotubes) was then added to the solution. The whole solution was reacted at 50-100° C. for one hour, such that a ring-opening reaction was carried out between a portion of epoxy groups of the PGMA grafted carbon nanotubes and 2-mercaptopropionic acid. The epoxy groups of the polymer chains were reacted with 2-mercaptopropionic acid, such that the portion of epoxy groups were replaced with thiol groups at ends of a portion of the polymer chains. The heat dissipation coating material of Example 2 was thus obtained.

Afterwards, the heat dissipation coating material was coated on the surface of the substrate. The heat dissipation coating material was dispersed in methyl ethyl ketone and diluted to a concentration of 3 wt %. The aluminium heat dissipation fin (as shown in FIG. 6) was done with an acid dipping treatment and then dried. Thereafter, the heat dissipation coating material was deposited on the aluminium surface by dipping or spraying, wherein thiol groups adsorbed and are bonded to the aluminium surface. The carbon nanotubes were dipped in 0.5% ethylenediamine solution to allow the epoxy groups thereof to cross-link with each other, and then baked at 100° C. to complete the reaction. Finally, a carbon nanotube thin film was formed on the aluminium surface. The sample of Example 2 was thus completed.

FIG. 4 illustrates a thermogravity analysis (TGA) of the heat dissipation coating material of Example 2 (represented by CNT-PGMA-SH) of the disclosure. As shown in FIG. 4, the polymer shells of the heat dissipation coating material of Example 2 are completely thermal-decomposed at 250-350° C., and the polymer shells are about 15% as calculated from the weight loss.

Afterwards, heat dissipation properties of the sample of Example 2 such as radiation emission, coating layer thickness, thermal resistance and thermal conductivity are evaluated. The measuring methods and results are detailed in below.

Example 3

In Example 3, a surface modification was performed to 1,000 mesh of graphite powder. With carbon $sp^2$ structure on the surface of the graphite powder, the epoxy-containing polymer such as PGMA was directly grafted onto the graphite powder through radical polymerization. Thus, PGMA grafted graphite powder was obtained after purification and separation. A portion of epoxy groups were thiolated with the described steps, so as to obtain the modified graphite powder of Example 3. The modified graphite powder of Example 3 was applied to the aluminium heat dissipation fin which was done with the adequate surface treatment. Afterwards, the graphite powder was dipped in 0.5% ethylenediamine solution and then baked at 100° C. to complete the reaction. Finally, a graphite powder thin film was formed on the aluminium surface. The sample of Example 3 was thus completed.

FIG. 4 illustrates a thermogravity analysis of the heat dissipation coating material of Example 3 (represented by GP-PGMA-SH) of the disclosure. As shown in FIG. 4, the polymer shells of the heat dissipation coating material of Example 3 are completely thermal-decomposed at 250-350° C., and the polymer shells are about 10% as calculated from the weight loss.

Afterwards, heat dissipation properties of the sample of Example 3 such as radiation emission, coating layer thickness, thermal resistance and thermal conductivity are evaluated. The measuring methods and results are detailed in below.

Example 4

In Example 4, a surface modification was performed to XC-72R carbon black. With carbon $sp^2$ structure on the surface of the carbon black, the epoxy-containing polymer such as PGMA was directly grafted onto the carbon black through radical polymerization. Thus, PGMA grafted carbon black was obtained after purification and separation. A portion of epoxy groups were thiolated with the described steps, so as to obtain the modified carbon black of Example 4. The modified carbon black of Example 4 was then applied to the aluminium heat dissipation fin which was done with the adequate surface treatment. Afterwards, the carbon black was dipped in 0.5% ethylenediamine solution and then baked at 100° C. to complete the reaction. Finally, a carbon black thin film was formed on the aluminium surface. The sample of Example 4 was thus completed.

FIG. 4 illustrates a thermogravity analysis of the heat dissipation coating material of Example 4 (represented by CB-PGMA-SH) of the disclosure. As shown in FIG. 4, the polymer shells of the heat dissipation coating material of Example 4 are completely thermal-decomposed at 250-350° C., and the polymer shells are about 12% as calculated from the weight loss.

Afterwards, heat dissipation properties of the sample of Example 4 such as radiation emission, coating layer thickness, thermal resistance and thermal conductivity are evaluated. The measuring methods and results are detailed in below.

Example 5

Substrate Surface Treatment

An aluminium fin was dipped into a buffered oxide etch solution (brand name: buffered oxide etch 6:1, purchased from J.T. Baker) for about 0.5 minute to about 10 minutes to remove the metal oxide layer on the surface of the aluminium fin, and the aluminium fin was then moved into water, cleaned, and dried. After that, the aluminium fin was dipped into 3-mercaptopropionic acid for about 0.5 minute to about 10 minutes, taken out and cleaned by tetrahydrofuran, and dried.

Preparation of Modified Carbon Particles 1,000 mesh of graphite powder was weighed and added to a beaker. 100 ml of dimethylsulfoxide and 100 ml of monomer solution of glycidyl methacrylate (GMA) were mixed and added to the beaker, and 10 g of benzoyl peroxide (BPO) was gradually added thereto. A polymerization reaction of the monomer solution with the added BPO was carried out at 80° C. under ultrasonic, such that a portion of the polymer radicals were directly grafted onto the graphite powder. Thereafter, the graphite powder grafted with polymer (or called PGMA grafted graphite powder) in the solution was isolated by high-speed centrifugation and free polymer was removed.

FIG. 4 illustrates a thermogravity analysis (TGA) of the heat dissipation coating material of Example 5 (represented by GP-PGMA) of the disclosure. As shown in FIG. 4, the polymer shells of the heat dissipation coating material of Example 5 are completely thermal-decomposed at 250-350° C., and the polymer shells are about 10% as calculated from the weight loss.

Formation of Heat Dissipation Layer

The PGMA grafted graphite powder was dispersed in methyl ethyl ketone and diluted to a concentration of 0.1 wt % to 10 wt %. Besides, the aluminium fin was done with an adequate surface treatment and then dried, and a graphite powder film was deposited on the surface of the aluminium fin by immersion or spraying. After the aluminium fin with the deposited graphite powder film was dipped in an ethylenediamine solution with the concentration of 0.5% to 5%, a baking process was performed at 60° C. to 100° C. to allow parts of the epoxy groups of the polymer shells covering the graphite powder to cross-link with each other, and to allow another parts of the epoxy groups of the graphite powder to cross-link with the thiol groups on the surface of the aluminium fin. Therefore, a graphite powder film as a composite carbon material layer was formed on the surface of the aluminium fin.

Comparative Example 1

The sample of Comparative Example 1 was an unmodified aluminium heat dissipation fin. Heat dissipation properties of the sample of Comparative Example 1 such as radiation emission, coating layer thickness, thermal resistance and thermal conductivity are evaluated. The measuring methods and results are detailed in below.

Comparative Example 2

The sample of Comparative Example 2 was an aluminium heat dissipation fin coated with a traditional material through traditional electrostatic spraying. As disclosed in Taiwan patent application no. TW 97146218, hydroxyl groups (—OH) on surfaces of carbon nanocapsules (CNC) were modified by hydrogen peroxide added with ferric salt, and 1.5% modified CNC and 98.5% polyester were mixed to form a heat dissipation coating material. The heat dissipation coating material of Comparative Example 2 was applied to the aluminium heat dissipation fin through traditional electrostatic spraying.

Afterwards, heat dissipation properties of the sample of Comparative Example 2 such as radiation emission, coating layer thickness, thermal resistance and thermal conductivity are evaluated. The measuring methods and results are detailed in below.

TABLE 1

| | Comparative Example 1 | Comparative Example 2 | Example 1 | Example 2 | Example 3 | Example 4 | Example 5 |
|---|---|---|---|---|---|---|---|
| Coating method | — | electrostatic spraying | self-assembly | self-assembly | self-assembly | self-assembly | immersion or spraying |
| Substrate material | Al | Al | Al | Al | Al | Al | Al |
| Substrate treatment | No | No | No | No | No | No | dipped into 3-mercapto-propionic acid |
| Material of polymer shell | Without polymer shell | CNC + polyester | ND-PGMA-SH | CNT-PGMA-SH | GP-PGMA-SH | CB-PGMA-SH | GP-PGMA |
| Radiation emission $\epsilon$ | 0.534 | 0.945 | 0.913 | 0.929 | 0.921 | 0.962 | 0.912 |
| Thermal conductivity (W/m·k) | — | 0.7 | 7.1 | 8.22 | 7.36 | 6.27 | 7.2 |
| Coating layer thickness (μm) | — | ~45 | ~10 | ~9 | ~15 | ~7 | ~13 |
| Equilibrium heat flow Qh (w) | 5.28 | 5.57 | 5.62 | 5.72 | 5.65 | 5.71 | 5.60 |
| Atmosphere temperature Ta (°C.) | 26.3 | 25.7 | 26.1 | 27.4 | 26.0 | 26.3 | 26.0 |
| Interface temperature Tc (°C.) | 81.37 | 75.81 | 75.25 | 75.91 | 75.02 | 74.35 | 75.30 |
| Thermal resistance R (°C./W) | 10.43 | 9.00 | 8.74 | 8.48 | 8.68 | 8.42 | 8.8 |
| Reduction ratio of thermal resistance Δ R | — | 13.7% | 16.2% | 18.7% | 16.8% | 19.3% | 15.7% |

The interface temperature (Tc) of the sample surface, heat flow (Qh) and etc. are acquired by using a heat source generator (Manufacturer: Longwin, Model: LW9053) to generate heat source at specific power. Specifically, the interface temperature and the heat flow are simulated and calculated by the heat simulator with extrapolation.

The radiation emission of the coating layer is tested as follows. The sample is put above a heater (Manufacturer: Grant, Model: QBT1 Grant) in black body box, and the heater is adjusted to provide an environment with stable temperature. The heater is ready for the testing after the starting temperature thereof is stable for one hour. The radiation temperature of the sample is shown by the thermal imager which is placed 20 cm above the block heater. The testing starts after the sample to be tested is placed on heater in black body box for 60 minutes to reach the thermal equilibrium. The radiation emission $\epsilon$ is calculated according to Stefan-Boltzmann Law $W=\epsilon\sigma T^4$, wherein W is radiation power per unit area, $\sigma$ is Stefan-Boltzmann constant and T is sample temperature (absolute temperature °K).

The thickness of the coating layer is measured with an α-stepper.

Figure 7:
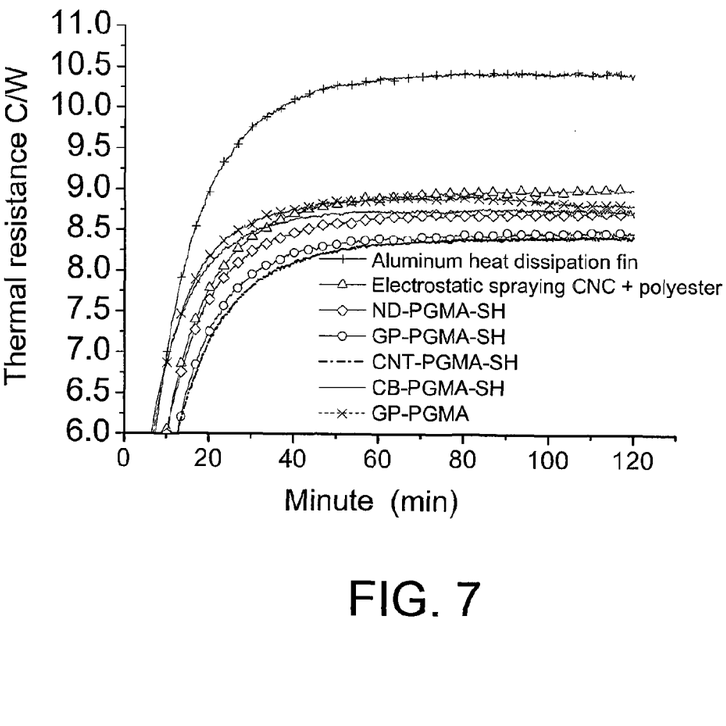
FIG. 7 illustrates thermal resistance as a function of time of the samples of Examples and Comparative Examples.

The thermal resistance and reduction ratio of thermal resistance are respectively calculated from the following formulae (1) and (2). FIG. 7 illustrates thermal resistance as a function of time of the samples of Examples and Comparative Examples. The interface temperature (Tc) and the thermal heat flow (Qh) increase with time, and are not varied remarkably until the equilibrium temperature and the equilibrium thermal resistance are reached.

$$\text{Thermal resistance } R=(Tc-Ta)/Qh \quad (1)$$

$$\text{Reduction ratio of thermal resistance } \Delta R=(R_{Comparative\ Example\ 1}-R)/R_{Comparative\ Example\ 1} \quad (2)$$

Referring to Table 1, the samples of Examples 1-5 and Comparative Example 2 have similar radiation emission, wherein the sample of Example 4 (coated with the modified carbon black) has the highest radiation emission. Further, the thermal conductivities of the samples of Examples 1-5 are much higher than the thermal conductivity of the sample of Comparative Example 2, wherein the sample of Example 2 (coated with the modified carbon nanotubes) has the highest thermal conductivity. In addition, the coating thicknesses of the samples of Examples 1-5 are much less than the coating thickness of the sample of Comparative Example 2. The thermal resistance is lowered as the thickness is reduced. Therefore, as compared with the aluminium heat dissipation fin of Comparative Example 1, the samples of Examples 1-4 can reduce the thermal resistance ratio up to 19.3%, which is higher than 13.7% of Comparative Example 2.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A self-assembly coating material, comprising:
   a plurality of carbon particles; and
   a plurality of polymer shells, respectively covering and bonded to the carbon particles, wherein each polymer shell has a first functional group and a second functional group, the first functional groups comprise thiol groups, and the second functional groups comprise epoxy groups,
   wherein each polymer shell comprises a plurality of polymer chains, and each polymer chain comprises partially-thiolated polyglycidyl methacrylate (PGMA) or partially-thiolated poly 2-(4-vinylphenyl)oxirane.

2. The self-assembly coating material of claim 1, wherein each first functional group is for adsorbing on a surface of a substrate, and the substrate comprises a metal.

3. The self-assembly coating material of claim 1, wherein the carbon particles are selected from the group consisting of carbon nanotubes, diamond particles, graphite powder, carbon black, carbon fibers, graphenes and mixtures thereof.

4. The self-assembly coating material of claim 1, wherein the polymer shells account for about 1-20 wt % of the self-assembly coating material.

5. The self-assembly coating material of claim 1, wherein the polymer shells account for about 5-15 wt % of the self-assembly coating material.

6. The self-assembly coating material of claim 1, wherein a weight-average molecular weight of each polymer chain ranges from about 50,000 to about 150,000.

7. The self-assembly coating material of claim 1, wherein the coating material is self-assembled on a substrate without adhesive.

* * * * *